United States Patent
Altman et al.

(10) Patent No.: US 6,940,938 B2
(45) Date of Patent: Sep. 6, 2005

(54) PHASE LOCKED LOOP HAVING A SINGLE SIDEBAND MODULATOR

(75) Inventors: Michael W. Altman, Folsom, CA (US); Issy Kipnis, Berkeley, CA (US)

(73) Assignee: Intel Corporation, Santa Clara, CA (US)

( * ) Notice: Subject to any disclaimer, the term of this patent is extended or adjusted under 35 U.S.C. 154(b) by 251 days.

(21) Appl. No.: 10/209,801

(22) Filed: Jul. 31, 2002

(65) Prior Publication Data

US 2004/0022338 A1 Feb. 5, 2004

(51) Int. Cl.⁷ .............................. H03D 3/24; H04L 7/00
(52) U.S. Cl. ..................... 375/376; 375/354; 375/371; 375/373
(58) Field of Search ................................ 375/316, 354, 375/355, 371, 372, 373, 374, 375, 376

(56) References Cited

U.S. PATENT DOCUMENTS

| | | | | |
|---|---|---|---|---|
| 4,061,973 A | * | 12/1977 | Reimers et al. .............. 455/76 |
| 4,464,638 A | * | 8/1984 | Crowley et al. ............. 331/1 A |
| 5,150,078 A | * | 9/1992 | Yang et al. .................... 331/2 |
| 5,323,638 A | * | 6/1994 | Langdon ...................... 73/32 A |
| 5,451,910 A | * | 9/1995 | Guthrie ........................ 331/16 |
| 5,847,615 A | * | 12/1998 | Roth ............................ 331/16 |
| 5,926,640 A | * | 7/1999 | Mason et al. ............... 713/320 |
| 6,028,493 A | * | 2/2000 | Olgaard et al. ............. 332/103 |
| 6,087,865 A | * | 7/2000 | Bradley ...................... 327/117 |
| 6,115,586 A | * | 9/2000 | Bezzam et al. ............. 455/112 |
| 6,373,344 B1 | * | 4/2002 | Mar ............................. 331/96 |
| 6,384,772 B1 | * | 5/2002 | Bradley ...................... 342/172 |
| 6,396,355 B1 | * | 5/2002 | Rezin .......................... 331/18 |
| 6,526,265 B1 | * | 2/2003 | Damgaard et al. .......... 455/118 |

FOREIGN PATENT DOCUMENTS

| WO | WO 01/01562 A1 | 1/2001 |
|---|---|---|
| WO | WO 01/91299 A2 | 11/2001 |

* cited by examiner

*Primary Examiner*—Stephen Chin
*Assistant Examiner*—Jason M. Perilla
(74) *Attorney, Agent, or Firm*—Trop, Pruner & Hu, P.C.

(57) ABSTRACT

A technique includes detecting a phase difference between an input signal and a first signal. A second signal is generated that has a fundamental frequency indicative of the phase difference. The second signal is modulated to produce the first signal.

12 Claims, 3 Drawing Sheets

PHASE LOCKED LOOP HAVING A SINGLE SIDEBAND MODULATOR

BACKGROUND

The invention generally relates to a phase locked loop.

A phase locked loop (PLL) is used for purposes of synchronizing the phases of two signals together. For example, FIG. 1 depicts a typical PLL 5 that includes a Voltage Controlled Oscillator (VCO) 7, a loop filter 9 and a phase detector 10. The phase detector 10 includes an input terminal 13 that receives an input signal that is "locked" onto by the PLL 5. In this manner, the phase detector 10 compares the input signal with an output signal (of the PLL 5) that is generated by the VCO 7 at its output terminal 11. Based on the detected phase difference between the input and output signals, the phase detector 10 generates a control signal that propagates through the loop filter 9 to the input terminal 8 of the VCO 7. The VCO 7 controls the frequency of the output signal based on the voltage level of the control signal. Due to this closed loop control, the PLL 5 "locks" onto the phase of the input signal so that the output signal has a predefined phase relationship (a zero, ninety or one hundred eighty degree relationship, as examples) with respect to the input signal.

The VCO 7, in its steady state, typically operates at a frequency that is either the same or an integer multiple of the frequency of the input signal. Thus, typically, the output signal has a frequency that is the same as or an integer multiple of the input signal. However, such an arrangement may be subject to noise. In this manner, for a typical oscillator, such as an inductor capacitor (LC)-based tank circuit, the oscillator output noise spectrum (i.e., the noise that is present in the oscillator's output signal) may be defined by the following equation:

$$|H(\delta\omega)|^2 \approx \frac{1}{4\pi^2 \cdot Q}\left(\frac{\omega_0}{\delta\omega}\right)^2, \qquad \text{Eq. 1}$$

where "$|H(\delta\omega)|^2$" represents the output noise spectrum of the oscillator, "Q" represents the Q factor of the inductor, "$\omega_o$" represents the resonant frequency of the oscillator and "$\delta\omega$" represents the spectral frequency.

As depicted in FIG. 2 in a graph of the oscillator's output noise versus frequency, the oscillator is highly susceptible to external noise at the resonant frequency, the fundamental frequency of operation of the oscillator. This external noise may be introduced by, for example, the substrate in which the oscillator is fabricated and may also be attributable to the power supply that powers the oscillator. Furthermore, the extent of the introduced external noise is specifically dependent upon the integrated circuit fabrication technology. For example, in complementary metal-oxide-semiconductor (CMOS) fabrication, the noise may be attributable to substrate coupling, which modulates the threshold voltage of the metal oxide semiconductor field-effect-transistors (MOSFETs) of the oscillator, and the noise may also be attributable to, for example, capacitive coupling effects present at the source and drain terminals of the MOSFETs of the oscillator.

Regardless of the sources of the noise, in a typical PLL, the presence of noise in the output signal from the oscillator introduces a phase noise, or jitter, between the input and output signals of the PLL, thereby adversely affecting operation of the PLL.

Thus, there is a continuing need for an arrangement to address one or more of the problems that are stated above.

DETAILED DESCRIPTION

For purposes of reducing jitter, a voltage controlled oscillator (VCO) of a phase locked loop (PLL) in accordance with an embodiment of the invention has a fundamental frequency of operation (i.e., a resonant frequency) that is slightly offset from the fundamental frequency of an output signal of the PLL. Due to this offset, the noise in the output signal of the PLL is significantly reduced, as compared to the noise present in the output signal if the output signal had the same fundamental frequency as the VCO. As described below, in some embodiments of the invention, single sideband modulation (SSM) is used to produce this frequency offset.

Figure 4:
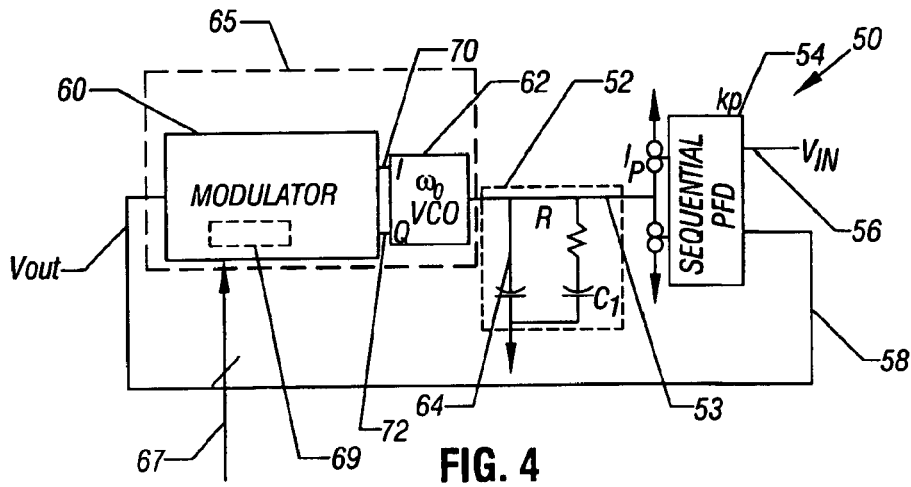
FIG. 4 is a schematic diagram of a phase locked loop according to an embodiment of the invention.

More specifically, referring to FIG. 4, an embodiment 50 of a PLL in accordance with the invention generates an output signal called $V_{OUT}$. The PLL 50 includes a VCO 62 that generates in-phase and quadrature sinusoidal signals in response to a phase comparison that is made by a phase detector 54 (of the PLL 50) that is coupled to the VCO 62. Thus, the frequencies of these signals are controlled by the phase difference that is indicated by the phase detector 54. In this manner, the phase detector 54 has a first input terminal 56 that receives an input signal (called "$V_{IN}$") of the PLL 50 and a second input terminal 58 that receives the $V_{OUT}$ signal. The phase detector 54 compares the $V_{IN}$ and $V_{OUT}$ signals and in response to this comparison, produces a control signal on a control signal line 53. A loop filter 52 is coupled between the control signal line 53 and an input terminal 64 of the VCO 62.

Unlike conventional PLLs, the PLL 50 includes an additional component, a modulator 60, that modulates the in-phase and quadrature signals that are provided by the VCO 62 to produce the $V_{OUT}$ output signal. This modulation, in turn, causes the fundamental frequency (called "$\omega_{OUT}$") of the $V_{OUT}$ signal to be offset from a fundamental frequency (called "$\omega_0$"), or resonant frequency, of the VCO 62. As noted above, due to this frequency shift, noise in the $V_{OUT}$ signal is significantly reduced, as compared to the conventional arrangement in which the fundamental frequency of the $V_{OUT}$ signal is equal to $\omega_0$. Thus, due to the frequency offset, potential jitter at the phase detector 54 is circumvented by the reduction of noise in the $V_{OUT}$ signal. With the addition of the modulator 60, an oscillator 65 is effectively formed from the VCO 62 and the modulator 60. However, this oscillator 65 has a resonant frequency of $\omega_0$, a frequency that is offset from the $\omega_{OUT}$ fundamental frequency of the $V_{OUT}$ signal.

As an example, in some embodiments of the invention, the $V_{IN}$ and $V_{OUT}$ signals may be clock signals.

In some embodiments of the invention, the modulator 60 uses single sideband (SSB) modulation, a modulation in which signals with two different fundamental frequencies are multiplied together to create frequency components at the sum and difference frequencies. In this manner, one of these fundamental frequencies is the $\omega_0$ frequency, the resonant or fundamental frequency of operation of the VCO 62, and the modulator 62 generates the other fundamental frequency by dividing the $\omega_0$ frequency. In this manner, as described below, in some embodiments of the invention, this division may be accomplished by a frequency divider circuit such that the modulator 60 produces in-phase and quadrature signals that each have a fundamental frequency that is equal to the $\omega_0$ frequency divided by some programmable integer. It is noted that in other embodiments of the invention, integer division may not be used.

In the SSB modulation performed by the modulator 60 in some embodiments of the invention, the product of the modulation (the $V_{OUT}$ signal) has the following time relationship:

$$V_{OUT} = \left(\sin(\omega_0 t)\cdot\cos(\frac{\omega_0 t}{n}+\frac{\pi}{2})\right) \pm \left(\sin(\omega_0 t+\frac{\pi}{2})\cdot\cos(\frac{\omega_0 t}{n})\right), \quad \text{Eq. 2}$$

wherein "$\omega_0$" is the fundamental frequency of operation of the oscillator 60, and "n" represents an integer.

Due the SSB modulation, the following relationship is formed between $\omega_{OUT}$, the frequency of the $V_{OUT}$ signal, and $\omega_0$:

$$\omega_{OUT} = \omega_0 \pm \frac{\omega_0}{n} \quad \text{Eq. 3}$$

Alternatively, in some embodiments of the invention, the lower frequency that is used for purposes of modulating the $\omega_0$ frequency is not produced by a frequency divider. Instead, for these embodiments of the invention, the lower frequency is produced by a fixed frequency oscillator that generates quadrature and in-phase output signals at a frequency that is independent from the $\omega_0$ frequency. Thus, for these embodiments, this fixed frequency oscillator operates independently from the VCO 62. Therefore, for these embodiments, the $\omega_{OUT}$ frequency is defined by the following relationship:

$$\omega_{OUT}=\omega_0\pm\omega_{OFFSET}, \quad \text{Eq. 4}$$

where "$\omega_{OFFSET}$" represents the frequency of the fixed frequency oscillator. Other variations are possible.

Figure 1:
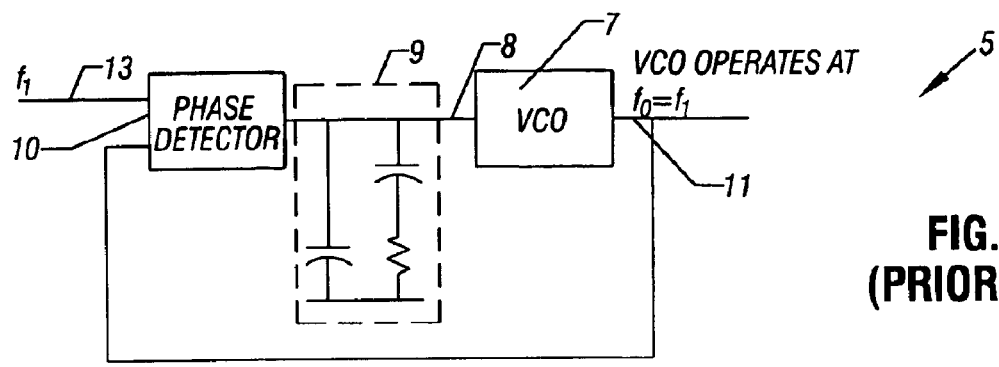
FIG. 1 depicts a phase locked loop of the prior art.
Figure 2:
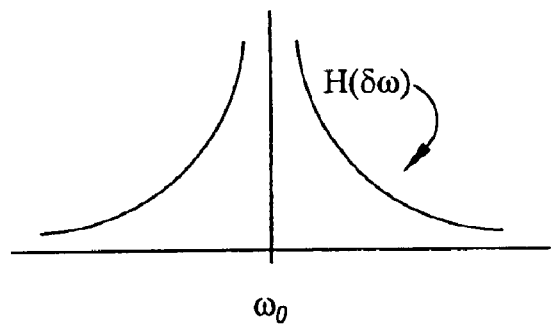
FIG. 2 depicts an output noise spectrum for a typical oscillator.
Figure 3:
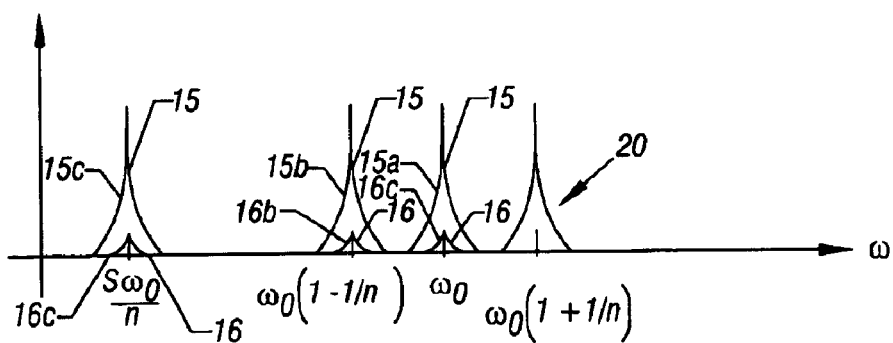
FIG. 3 is an illustration of a spectral distribution of an output signal of a phase locked loop according to an embodiment of the invention.

Referring to FIG. 3, due to the SSB modulation, unwanted sidebands 15 (sidebands 15a, 15b and 15c depicted as examples) in the $V_{OUT}$ signal are substantially diminished to smaller magnitude sidebands 16 (sidebands 16a, 16b and 16c, depicted as examples), as compared to the $V_{OUT}$ signal being produced directly from the VCO 62.

As depicted in FIG. 3, in some embodiments of the invention, phase discrimination is used to produce the single sideband. In some embodiments of the invention, this phase discrimination results in high side mixing, a mixing that produces a desired sideband 20 that is located at a frequency of $\omega_0+\omega_0/n$. For these embodiments, the SSB modulation diminishes the $\omega_0$ frequency spectral component and spectral components less than the $\omega_0$ frequency. However, in other embodiments of the invention, the other sideband is selected. In this manner, in other embodiments of the invention, the $\omega_0$ spectral component as well as spectral components located at frequencies greater than the $\omega_0$ frequency, may be diminished, i.e., the SSB modulation may produce low side mixing.

The VCO 62 furnishes both an in-phase signal and a quadrature signal (a signal that has the same frequency as the quadrature signal but is shifted by 90° in phase relative to the in-phase signal) to the modulator 60. In this manner, referring to FIG. 5, an embodiment of the modulator 60 in accordance with the invention includes a mixer 74 that receives the in-phase signal from the VCO 62 at its input terminal 70. Another mixer 82 of the modulator 60 receives the quadrature signal from the VCO 62 at its input terminal 72. The mixer 74 multiplies the in-phase signal with a lower frequency version of this in-phase signal that is present at the mixer's input terminal 78. Similarly, the mixer 82 multiplies the quadrature signal with a lower frequency version of this quadrature signal that is present at the mixer's input terminal 80.

The signals present on the input terminals 78 and 80 are produced by a frequency divider circuit 76, a circuit that receives the in-phase and quadrature signals that are provided by the VCO 62. In this manner, the frequency divider circuit 76 divides the frequency of the in-phase signal by a programmable integer (called "n") to produce the signal at the input signal line 78, and the frequency divider 76 divides the frequency of the quadrature signal to produce the signal at the input terminal 80. The value for "n" may be established by writing to a register 69 of the modulator 60. This register 69 may be accessed via data, address and control lines 67.

The output signals that are generated by the mixers 74 and 82 due to the above-described multiplications are summed together by an adder 90 of the modulator 60. An output terminal 92 of the adder 90 provides the $V_{OUT}$ signal.

Figure 6:
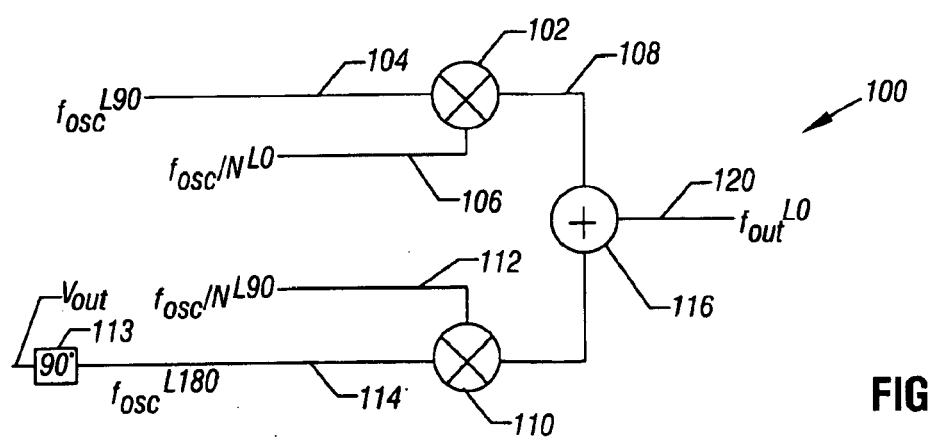

Due to the SSB modulation, the phase of the $V_{OUT}$ signal is shifted by approximately 90 degrees relative to the $V_{IN}$ signal, i.e., the $V_{OUT}$ signal is a quadrature signal with respect to the $V_{IN}$ signal, a signal that may be labeled an "in-phase" signal. It may be desirable to produce a $V_{OUT}$ signal that is in phase with the $V_{IN}$ signal. For example, such is the case for a half rate receiver, circuit that uses both quadrature and in-phase clock signals. Referring to FIG. 6, for purposes of producing an in-phase version of the $V_{OUT}$ signal, in some embodiments of the invention, another modulator 100 may be used to take advantage of some of the signals that produced by the modulator 60 for purposes of generating a signal that is in phase with the $V_{IN}$ signal.

Figure 5:
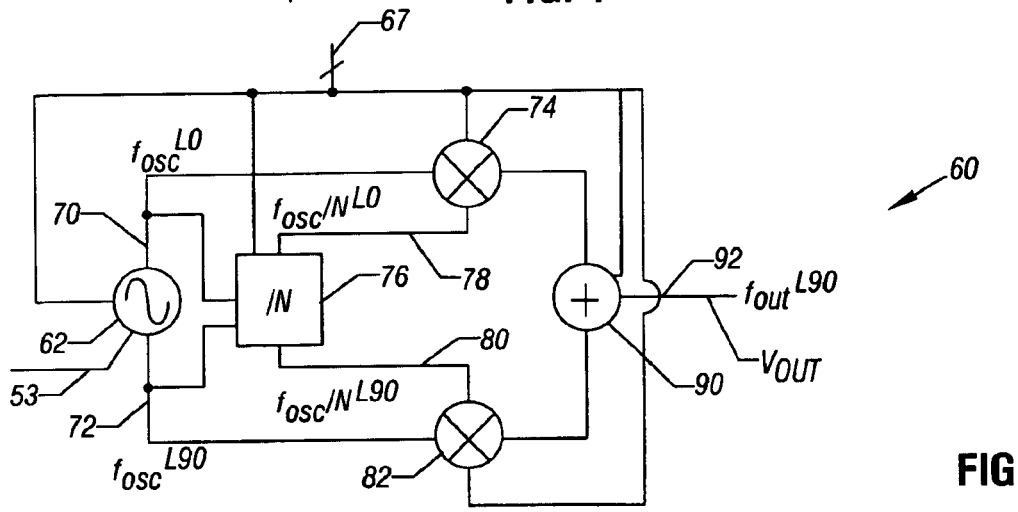
FIGS. 5 and 6 are schematic diagrams of single sideband modulators according to embodiments of the invention.

Referring to FIGS. 5 and 6, the modulator 100 has a similar design to the modulator 60, with the exception that the modulator 100 does not have the frequency divider circuit 76 of the modulator 60. Instead, modulator 100 uses the frequency divided in-phase and quadrature signals that are provided by the frequency divider 76. In this manner, the modulator 100 includes a mixer 102 that includes an input terminal 104 that receives the same signal as the input terminal 78 of the mixer 74. However, the mixer 102 multiplies the signal present at the input terminal 104 with the $V_{OUT}$ signal. The modulator 100 also includes a mixer 110 that receives at its input terminal 112 the same signal as the input terminal 80 of the mixer 82. However, the mixer 110 multiplies the signal present at the input terminal 112 with a signal that is provided by a 90° phase shifter 113 and is effectively the $V_{OUT}$ signal shifted by ninety degrees. I.e., the mixer 110 multiplies the signal on its input terminal 112 with the inverted in-phase signal that is provided by the VCO 62. The output terminals of the two mixers 102 and 10 produce signals that are combined by an adder 116 of the modulator 100, and the output terminal 120 of the adder 116 furnishes an output signal that is in phase with the $V_{IN}$ signal. Thus, the output signal present at the output terminal 120 is an in-phase signal, and the $V_{OUT}$ signal is a quadrature signal relative to the signal present at the output terminal 120.

Figure 7:
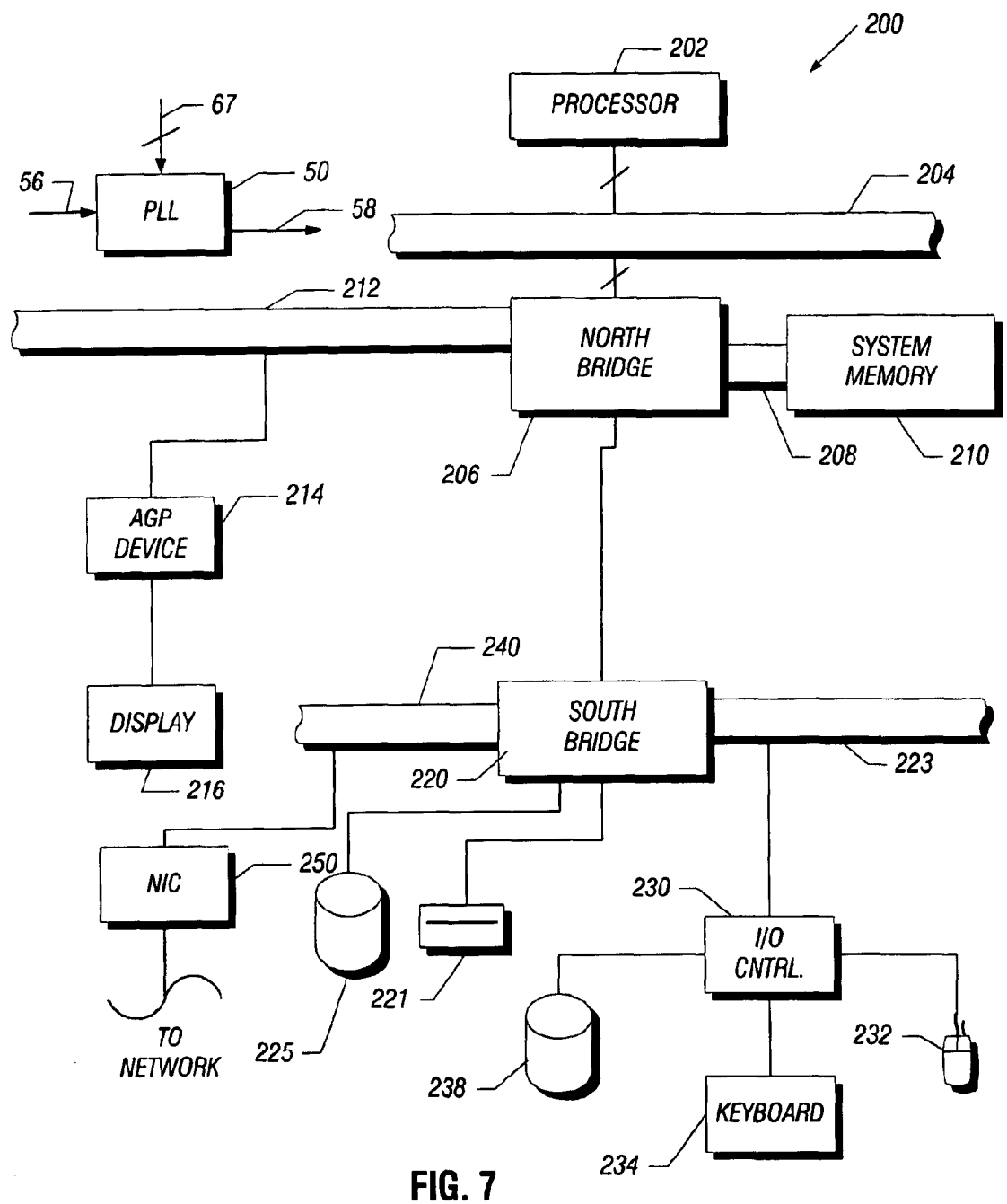
FIG. 7 is a schematic diagram of a computer system according to an embodiment of the invention.

Referring to FIG. 7, in some embodiments of the invention, the PLL 50 may be used in a computer system 200. For example, the PLL 50 may be located near or on a processor 202 (a microprocessor, for example) to provide a clock signal (i.e., the $V_{OUT}$ signal) to the processor 202 in response to another clock signal (i.e., the $V_{IN}$ signal) that is received by the PLL 50. Many such PLLs may be used throughout the computer system 200.

Besides the PLL 50, the computer system 200 may include, for example, a memory I/O hub, or north bridge 206, that is coupled to a local bus 204 along with the processor 202. The north bridge 206 serves as an interface between a system memory bus 208, the local bus 204 and Accelerated Graphics Port (AGP) bus 212 and a hub link to an I/O hub, or south bridge 220. The AGP is described in detail in the Accelerated Graphics Port Interface Specification, Revision 1.0, published on Jul. 31, 1996, by Intel Corporation of Santa Clara, Calif.

The south bridge 220, in turn, provides interfaces to a Peripheral Component Interconnect (PCI) bus 240 and an I/O expansion bus 223. The PCI Specification is available from The PCI Special Interest Group, Portland, Oreg. 97214. An I/O controller 230 may be coupled to the I/O expansion bus 223 and receive input from a keyboard 234 and a mouse 232. The I/O controller 230 may also control operation of a floppy disk drive 238. The south bridge 220, for example, controls operation of a CD-ROM drive 221 and controls operation of a hard disk drive 225. The PCI bus 240 may be coupled to, for example, a network interface card (NIC) 250 that provides an interface to a network for the computer system 200. Other variations are possible.

While the present invention has been described with respect to a limited number of embodiments, those skilled in the art, having the benefit of this disclosure, will appreciate numerous modifications and variations therefrom. It is intended that the appended claims cover all such modifications and variations as fall within the true spirit and scope of this present invention.

What is claimed is:

1. A phase locked loop circuit, comprising:
   a phase detector to detect a phase difference between an input signal and a first signal, the first signal having a first fundamental frequency;
   an oscillator coupled to the phase detector to provide a second fundamental frequency indicative of the phase difference;
   a single sideband modulator coupled to the oscillator, the modulator to divide the second fundamental frequency and modulate in response to the second fundamental frequency to establish the first fundamental frequency of the first signal to be offset from the second fundamental frequency of the oscillator; and
   another modulator coupled to the single sideband modulator to generate a second signal shifted in phase from the first signal, the second signal having the same first fundamental frequency.

2. The phase locked loop circuit of claim 1, wherein the oscillator provides at least one signal having the second fundamental frequency, and the single sideband modulator comprises:
   a frequency divider to, for each of said at least one signal having the second fundamental frequency, produce an associated frequency-divided signal; and
   at least one multiplier, each of said at least one multiplier multiplying a different one of said frequency-divided signals with the associated signal provided by the oscillator.

3. The phase locked loop circuit of claim 1, wherein the oscillator provides a first quadrature signal having the second fundamental frequency and a first in-phase signal having the second fundamental frequency, and the single sideband modulator comprises:
   a frequency divider to:
     produce a second quadrature signal having a frequency that is less than the second fundamental frequency, and
     produce a second in-phase signal having a frequency that is less than the second fundamental frequency;
   a first multiplier to multiply the first and second quadrature signals together;
   a second multiplier to multiply the first and second in-phase signals together; and
   an adder to produce the first signal in response to multiplications by the first and second multipliers.

4. The phase locked loop circuit of claim 3, wherein the another modulator is coupled to the frequency divider to use the second quadrature signal and the second in-phase signal to generate the second signal.

5. A computer system, comprising:
   a phase detector to detect a phase difference between an input clock signal and a first clock signal, the first clock signal having a first fundamental frequency;
   an oscillator coupled to the phase detector to provide a second fundamental frequency indicative of the phase difference;
   a modulator coupled to the oscillator and providing the first clock signal, the modulator to divide the second fundamental frequency and modulate in response to the second fundamental frequency to establish the first fundamental frequency of the first clock signal to be offset from the second fundamental frequency of the oscillator;
   a processor to receive the first clock signal; and
   another modulator to generate a second clock signal shifted in phase from the first clock signal, the second clock signal having the same first fundamental frequency.

6. The computer system of claim 5, wherein the oscillator provides at least one signal having the second fundamental frequency, and the modulator comprises:
   a frequency divider to, for each of said at least one signal having the second fundamental frequency, produce an associated frequency-divided signal; and
   at least one multiplier, each of said at least one multiplier multiplying a different one of said frequency-divided signals with the associated signal provided by the oscillator.

7. The computer system of claim 5, wherein the oscillator provides a first quadrature signal having the second fundamental frequency and a first in-phase signal having the second fundamental frequency, and the modulator comprises:
   a frequency divider to:
   produce a second quadrature signal having a frequency that is less than the second fundamental frequency, and
   produce a second in-phase signal having a frequency that is less than the second fundamental frequency;
   a first multiplier to multiply the first and second quadrature signals together;

a second multiplier to multiply the first and second in-phase signals together; and an adder to produce the first signal in response to multiplications by the first and second multipliers.

8. The computer system of claim 7, wherein the another modulator is coupled to the frequency divider to use the second quadrature signal and the second in-phase signal to generate the second signal.

9. A phase locked loop circuit, comprising:

a phase detector to detect a phase difference between an input signal and a first signal, the first signal having a first fundamental frequency;

an oscillator coupled to the phase detector to provide a second fundamental frequency indicative of the phase difference;

a modulator coupled to the oscillator and providing the first signal, the modulator to divide the second fundamental frequency and modulate in response to the second fundamental frequency to establish the first fundamental frequency of the first signal to be offset from the second fundamental frequency of the oscillator; and another modulator to generate a second signal shifted in phase from the first signal, the second signal having the same first fundamental frequency.

10. The phase locked loop circuit of claim 9, wherein the oscillator provides at least one signal having the second fundamental frequency, and the modulator comprises:

a frequency divider to, for each of said at least one signal having the second fundamental frequency, produce an associated frequency-divided signal; and at least one multiplier, each of said at least one multiplier multiplying a different one of said frequency-divided signals with the associated signal provided by the oscillator.

11. The phase locked loop circuit of claim 9, wherein the oscillator provides a first quadrature signal having the second fundamental frequency and a first in-phase signal having the second fundamental frequency, and the modulator comprises:

a frequency divider to:
produce a second quadrature signal having a frequency that is less than the second fundamental frequency, and
produce a second in-phase signal having a frequency that is less than the second fundamental frequency;

a first multiplier to multiply the first and second quadrature signals together;

a second multiplier to multiply the first and second in-phase signals together; and an adder to produce the first signal in response to multiplications by the first and second multipliers.

12. The phase locked loop circuit of claim 11, wherein the another modulator is coupled to the frequency divider to use the second quadrature signal and the second in-phase signal to generate the second signal.

* * * * *

UNITED STATES PATENT AND TRADEMARK OFFICE
CERTIFICATE OF CORRECTION

PATENT NO. : 6,940,938 B2
DATED : September 6, 2005
INVENTOR(S) : Michael W. Altmann and Issy Kipnis It is certified that error appears in the above-identified patent and that said Letters Patent is hereby corrected as shown below:

<u>Title page,</u>
"Item [75] Inventors: Michael W. Altman, Folsom, CA (US);
　　　　　　　　　　Issy Kipnis, Berkley, CA (US)"
should be:
-- [75] Inventors: Michael W. Altmann, Folsom, CA (US);
　　　　　　　　Issy Kipnis, Berkley, CA (US) --.

Signed and Sealed this

Thirteenth Day of December, 2005

JON W. DUDAS
*Director of the United States Patent and Trademark Office*